(12) United States Patent
Schauer

(10) Patent No.: US 6,306,735 B1
(45) Date of Patent: Oct. 23, 2001

(54) METHOD FOR PRODUCING A SEMICONDUCTOR WAFER

(75) Inventor: Reinhard Schauer, Laufen (DE)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/568,914

(22) Filed: May 11, 2000

(30) Foreign Application Priority Data

May 12, 1999 (DE) .............................. 199 22 167

(51) Int. Cl.[7] .................................................. H01L 21/20
(52) U.S. Cl. .......................... 438/478; 438/481; 438/482; 438/492; 438/502; 438/509
(58) Field of Search ................................ 438/478, 481, 438/492, 500, 502, 507, 509

(56) References Cited

U.S. PATENT DOCUMENTS

| 4,522,842 | * | 6/1985 | Levinstein et al. ....................... 427/8 |
| 5,256,162 | * | 10/1993 | Drowley et al. ...................... 118/715 |
| 5,872,017 | * | 2/1999 | Boydston et al. ...................... 438/17 |
| 5,944,193 | | 8/1999 | Shimizu . | |
| 6,168,961 | * | 1/2001 | Vaccari ................................... 438/16 |

FOREIGN PATENT DOCUMENTS

| 0758143-A1 | * | 2/1997 | (EP) . |
| 0 863 540 | | 9/1998 | (EP) . |
| 0 911 869 | | 4/1999 | (EP) . |
| 2 275 366 | | 8/1994 | (GB) . |
| 97/28560 | | 8/1997 | (WO) . |
| 99/22403 | | 5/1999 | (WO) . |
| WO-60615 | * | 11/1999 | (WO) . |

OTHER PUBLICATIONS

Patent Abstracts of Japan, vol. 1998, No. 05, Apr. 30, 1998 Corresponding to US 5,944,193.
Patent Abstracts of Japan, vol. 2000, No. 02, Feb. 29, 2000 Corresponding to JP 11 329982.
English Derwent Abstract AN 1993–222210 [28] Corresponding to JP 05–144803.
English Derwent Abstract AN 1998–459090 [40] Corresponding to EPO 863540.

* cited by examiner

*Primary Examiner*—Trung Dang
(74) *Attorney, Agent, or Firm*—Collard & Roe, P.C.

(57) ABSTRACT

A method for producing a semiconductor wafer includes the deposition of an epitaxial layer onto a substrate wafer in a deposition reactor. The semiconductor wafer, following the deposition of the epitaxial layer, undergoes treatment in an ozone-containing atmosphere.

18 Claims, No Drawings

METHOD FOR PRODUCING A SEMICONDUCTOR WAFER

BACKGROUND OF THE INVENTION

1. Field of the Invention

The present invention relates to a method for producing a semiconductor wafer, in particular a silicon wafer, which is provided with an epitaxial layer. The present invention relates in particular to the treatment of the semiconductor wafer following deposition of the epitaxial layer by using an ozone containing atmosphere.

2. The Prior Art

It is known that the surface of a freshly deposited epitaxial layer tends to undergo reactions with suitable molecules in the atmosphere. The manufacturers of electronic components who subject such semiconductor wafers to further processing have an interest in ensuring that the surface of the semiconductor wafer is in a defined condition. This means that the semiconductor wafers which are to be further processed have surfaces in a uniform condition.

SUMMARY OF THE INVENTION

It is an object of the present invention to provide a semiconductor wafer having a surface which is in such a defined uniform condition. It is a further object of the present invention to permit the production of the semiconductor wafer to be incorporated into existing methods without particular difficulty and without particular costs.

The present invention relates to a method for producing a semiconductor wafer by deposition of an epitaxial layer onto a substrate semiconductor wafer in a deposition reactor, wherein the semiconductor wafer, following the deposition of the epitaxial layer, undergoes treatment in an ozone containing atmosphere.

The present invention is preferably integrated into existing deposition processes in which, in addition to one or more deposition reactors, closeable chambers are also provided for loading and unloading (load lock or air-tight stations). In addition, the treatment may also take place in an additionally provided treatment chamber. The temperature of the ozone containing atmosphere is 10° C. to 50° C., and preferably is at room temperature, or about 25° C. The duration of the treatment is preferably from 5 min to 20 min. This treatment results in a thin oxide film, which has the uniform quality desired by component manufacturers for all semiconductor wafers processed in this way. This thin oxide film is formed on the surface of the epitaxial layer.

It is particularly advantageous if it is ensured that the semiconductor wafer remains in a nonoxidizing atmosphere following the deposition of the epitaxial layer and prior to the treatment in the ozone containing atmosphere. It is particularly preferred for the semiconductor wafer to be conveyed from the deposition reactor into the treatment chamber in a nitrogen atmosphere, as the nonoxidizing atmosphere. It is also possible to employ an inert gas atmosphere, such as helium, neon, or argon, as the nonoxidizing atmosphere. In addition, the nonoxidizing atmosphere can be a reducing gas atmosphere such as hydrogen.

The ozone-containing atmosphere is preferably provided by UV radiation or using a commercially available ozonizer which is fed with air, particularly preferably fed with oxygen. The ozone containing gas emitted by the ozonizer is fed into the treatment chamber, displacing the atmosphere which has hitherto been present in the chamber. Alternatively, this atmosphere may also be removed by vacuum suction before the ozone-containing gas enters the treatment chamber.

According to a particularly preferred embodiment of the method, a first rack holding a plurality of semiconductor substrate wafers is loaded into a first chamber (load lock air-tight station) and is placed under a nonreactive gas atmosphere, preferably a nitrogen atmosphere. Then, the wafers are conveyed into the deposition reactor under the atmosphere which has been established. In this deposition reactor, the wafers are coated with the epitaxial layer individually or in small batches. Then, the semiconductor wafers formed are conveyed into a second chamber (load lock air-tight station) under a nonreactive, or inert, and in particular nonoxidizing atmosphere, and are collected in a further second rack.

As soon as the second rack has been filled, the semiconductor wafers undergo the treatment in the ozone containing atmosphere in the second chamber. During this time period, it is possible for the first chamber to be reloaded with semiconductor substrate wafers and for the first of these substrate wafers to be epitaxially coated. Naturally, it is also possible for the semiconductor wafers to be conveyed back into the first chamber following the coating and for the treatment in the ozone containing atmosphere to be carried out in this first chamber. During this time period, substrate wafers can be conveyed from the second chamber into the deposition reactor and coated.

The method of the present invention makes it possible to produce epitaxial semiconductor wafers with a uniform surface. Compared to wet chemical processes, which are able to provide a similar surface, this method is distinguished by costs which are at least 80% lower.

While a few embodiments of the present invention have been shown and described, it is to be understood that many changes and modifications may be made thereunto without departing from the spirit and scope of the invention as defined in the appended claims.

What is claimed is:

1. A method for producing a semiconductor wafer comprising depositing an epitaxial layer on a substrate semiconductor wafer in a deposition reactor;

following the depositing of the epitaxial layer, having the semiconductor wafer undergo treatment in an ozone-containing atmosphere;

transferring the semiconductor wafer into a load lock station in order to undergo the treatment in the ozone-containing atmosphere in said load lock station; and said load lock station is connected to the deposition reactor.

2. A method for producing a semiconductor wafer comprising depositing an epitaxial layer on a substrate semiconductor wafer in a deposition reactor;

following the depositing of the epitaxial layer, having the semiconductor wafer undergo treatment in an ozone-containing atmosphere;

providing a treatment chamber which is connected to the deposition reactor; and said semiconductor wafer undergoing the treatment in the ozone-containing atmosphere in said treatment chamber.

3. The method as claimed in claim 1, comprising exposing the semiconductor wafer to the ozone-containing atmosphere at an ambient temperature of 10° C. to 50° C.

4. The method as claimed in claim 1, comprising holding the semiconductor wafer in a nonoxidizing atmosphere following the depositing of the epitaxial layer and prior to the treatment in the ozone-containing atmosphere.

5. The method as claimed in claim 1, wherein the semiconductor wafer undergoes the treatment in the ozone-containing atmosphere together with other semiconductor wafers.

6. The method as claimed in claim 4, wherein said nonoxidizing atmosphere is an inert gas atmosphere.

7. The method as claimed in claim 6, wherein the inert gas atmosphere is selected from the group consisting of nitrogen, helium, neon and argon.

8. The method as claimed in claim 7, wherein the inert gas atmosphere is nitrogen.

9. The method as claimed in claim 4, wherein the nonoxidizing atmosphere is a reducing gas atmosphere.

10. The method as claimed in claim 9, wherein the reducing gas atmosphere is hydrogen.

11. The method as claimed in claim 2, comprising exposing the semiconductor wafer to the ozone-containing atmosphere at an ambient temperature of 10° C. to 50° C.

12. The method as claimed in claim 2, comprising holding the semiconductor wafer in a nonoxidizing atmosphere following the depositing of the epitaxial layer and prior to the treatment in the ozone-containing atmosphere.

13. The method as claimed in claim 2, wherein the semiconductor wafer undergoes the treatment in the ozone-containing atmosphere together with other semiconductor wafers.

14. The method as claimed in claim 12, wherein said nonoxidizing atmosphere is an inert gas atmosphere.

15. The method as claimed in claim 14, wherein the inert gas atmosphere is selected from the group consisting of nitrogen, helium, neon and argon.

16. The method as claimed in claim 15, wherein the inert gas atmosphere is nitrogen.

17. The method as claimed in claim 12, wherein the nonoxidizing atmosphere is a reducing gas atmosphere.

18. The method as claimed in claim 17, wherein the reducing gas atmosphere is hydrogen.

* * * * *